(12) United States Patent
Ogawa et al.

(10) Patent No.: US 8,389,953 B2
(45) Date of Patent: *Mar. 5, 2013

(54) FOCUSED ION BEAM APPARATUS (75) Inventors: Takashi Ogawa, Chiba (JP); Kenichi Nishinaka, Chiba (JP); Yoshihiro Koyama, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/931,993

(22) Filed: Feb. 15, 2011

(65) Prior Publication Data
US 2011/0204252 A1 Aug. 25, 2011

(30) Foreign Application Priority Data
Feb. 16, 2010 (JP) ................... 2010-031602

(51) Int. Cl.
*H01J 49/10* (2006.01)
*H01J 37/08* (2006.01)
*H01J 27/02* (2006.01)
*H01J 3/14* (2006.01)

(52) U.S. Cl. ........... 250/423 R; 250/396 R; 315/111.81; 315/111.91; 315/111.31; 118/723 R (58) Field of Classification Search .............. 250/423 R, 250/396 R; 315/111.31, 111.81, 111.91; 118/723 R
See application file for complete search history.

(56) References Cited

U.S. PATENT DOCUMENTS

| 7,755,065 | B2 * | 7/2010 | Nakagawa et al. | 250/492.21 |
| 2009/0230299 | A1 * | 9/2009 | Shichi et al. | 250/282 |
| 2010/0219339 | A1 * | 9/2010 | Ogawa et al. | 250/306 |
| 2011/0215256 | A1 * | 9/2011 | Ogawa et al. | 250/396 R |
| 2011/0233401 | A1 * | 9/2011 | Nishinaka et al. | 250/310 |

FOREIGN PATENT DOCUMENTS
WO  2007067328  6/2007

* cited by examiner

*Primary Examiner* — Nikita Wells
(74) *Attorney, Agent, or Firm* — Adams & Wilks (57) ABSTRACT A focused ion beam apparatus includes an ion gun unit having an emitter tip, a gas supply unit that supplies gas to the tip, and an ion source gas supply source. An extracting electrode ionizes the gas adsorbed onto the surface of the tip and extracts ions by applying a voltage between the extracting electrode and the tip. A cathode electrode accelerates the ions toward a sample. An aperture member has an opening that passes therethrough a part of the ion beam ejected from the ion gun unit, and a lens system focuses the ion beam onto the sample.

16 Claims, 7 Drawing Sheets

FOCUSED ION BEAM APPARATUS

BACKGROUND OF THE INVENTION

1. Field of the Invention

The present invention relates to a focused ion beam apparatus having a gas field ion source.

2. Description of the Related Art

In the related art, liquid metal gallium is employed as an ion source of a focused ion beam apparatus. In recent years, a focused ion beam apparatus employing a gas field ion source which is configured to supply an ion source gas to a fine tip, ionize the ion source gas adsorbed to the tip by a strong electric field formed at an extremity of the tip, and extract an ion beam is developed.

In the ion source using the liquid metal gallium in the related art, an opening angle of the ion beam ejected from the ion source is on the order of 20 degrees. In contrast, in the gas field ion source, since the ion beam is ejected from several atoms at the extremity of the tip, the opening angle of the ion beam is on the order of several degrees.

When using the gas field ion source, since the opening angle of the ion beam is small, accurate adjustment of the angle and the position with respect to an optical axis in an ion beam barrel is necessary in order to extract the ion beam so as to reach a sample surface from the ion source.

The gas field ion source having an adjusting mechanism configured to adjust the direction of the tip by itself is known (see WO2007067328, mainly FIG. 17).

According to the apparatus configured in this manner, even with the gas field ion source whose opening angle of ion beam is small, adjustment of extraction of the ion beam is achieved on the basis of accurate measurement.

However, the adjusting mechanism as described above has a complex structure, and hence the apparatus having the adjustment mechanism suffers from its costliness. It is often difficult with this mechanism to irradiate the ion beam stably, because the tip is subjected to vibrations.

SUMMARY OF THE INVENTION

In view of such circumstances, it is an object of the invention to provide a focused ion beam apparatus which achieves a stable beam irradiation without a complex structure.

In order to achieve the object described above, the invention proposes the following means.

The focused ion beam apparatus according to the invention includes a gas field ion gun unit having: an emitter tip; a gas supply unit configured to supply gas to the tip; an extracting electrode configured to ionize the gas adsorbed onto the surface of the tip and extract ions by applying a voltage between the extracting electrode and the tip; and a cathode electrode configured to accelerate the ions toward a sample; an aperture having an opening for allowing passage of a part of the ion beam ejected from the gas field ion gun unit therethrough; and a lens system configured to focus the ion beam onto the sample.

Accordingly, only the ion beam near the center of an optical axis of the ion beam ejected from the gas field ion gun unit is allowed to pass through the opening. Therefore, since only the ion beam near the center of the optical axis of the ion beam is allowed to enter the focusing lens, the peripheral component of the ion beam is prevented from being mixed with the central component. Therefore, the sample can be irradiated with a favorable beam having a preferable beam profile with a regular shape.

In the focused ion beam apparatus according to the invention, the lens system is arranged on the side of the sample with respect to the aperture. Accordingly, incoming of unnecessary components of the ion beam into the lens system can be alleviated. If impurity gas ionized without reaching the tip exists in the ion generating chamber, the ionized impurity gas is contained in the ion beam and varies the current amount as an unnecessary component of the ion beam. Therefore, the ion beam may become unstable. By restricting the ion beam entering the lens system with the aperture, variation of the ion beam current can be alleviated.

It is also possible to connect an ammeter to the aperture. Accordingly, the amount of ion beam current entering the aperture can be measured.

In the focused ion beam apparatus according to the invention, the ion beam ejected from the gas field ion gun unit can be deflected by the gun alignment electrode. Accordingly, an apparatus which does not require a complex and costly function such as mechanically adjusting the direction of the tip by itself and is highly resistant to vibrations from the outside is achieved.

In the focused ion beam apparatus according to the invention, the lens system is arranged on the side of the sample with respect to the gun alignment electrode. Accordingly, since the ion beam can be adjusted to be parallel to the optical axis, the sample can be irradiated with an ion beam with little aberration which is generated by entering obliquely into the optical system such as a lens. Here, the optical axis is an axis penetrating through the center of the lens.

The aperture can be subjected to the scanning irradiation of the ion beam by inputting a scanning signal into the gun alignment electrode. Accordingly, the position of the aperture can be confirmed by observing a secondary charged particle image.

In the focused ion beam apparatus according to the invention, the gas field ion gun unit includes a moving mechanism movable with respect to the lens system. Accordingly, the position of the ion beam entering the lens system can be adjusted by moving the ion gun unit relatively with respect to the lens system.

According to the focused ion beam apparatus in the invention, the sample can be irradiated with a stable beam without using a complex adjusting mechanism.

DETAILED DESCRIPTION OF THE INVENTION

Figure 1:
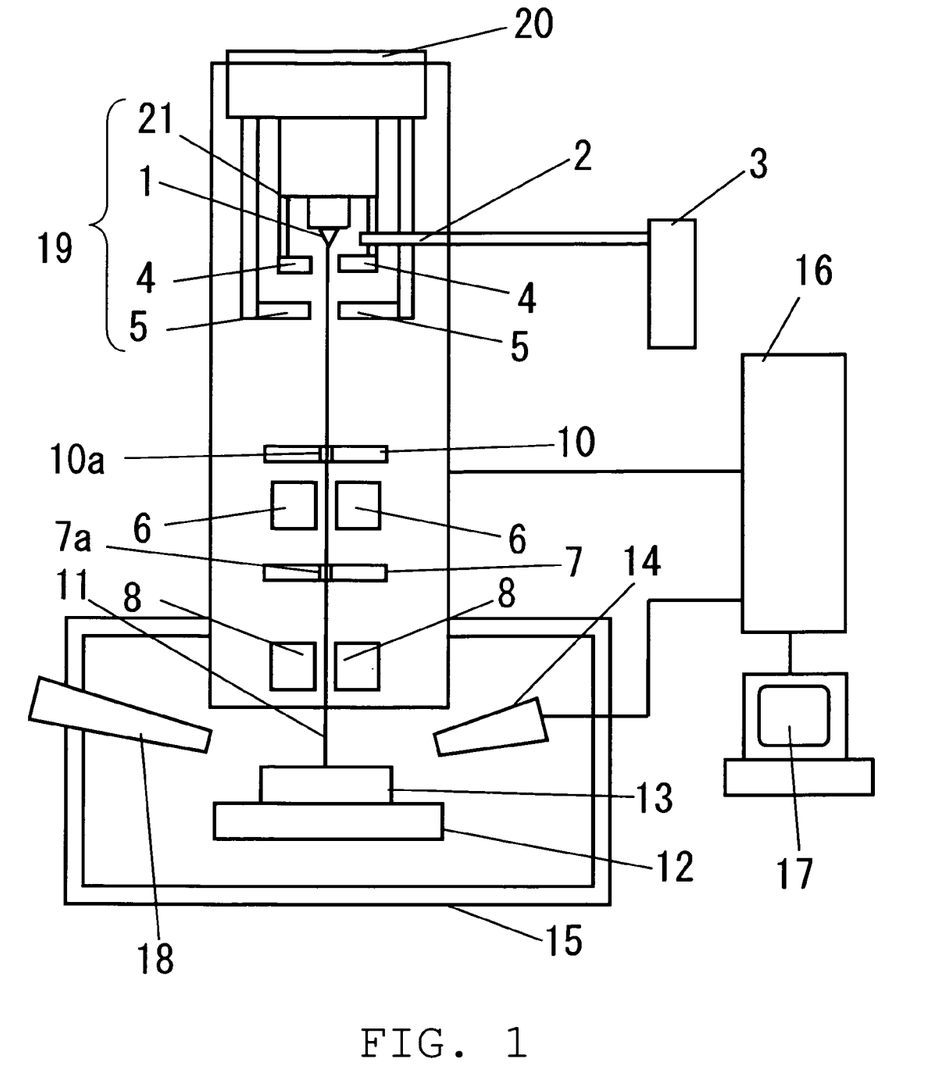
FIG. 1 is a drawing showing a configuration of a focused ion beam apparatus according to an embodiment of the invention.

An embodiment of the focused ion beam apparatus according to the invention will be described below with reference to FIG. 1.

The focused ion beam apparatus in this embodiment includes an emitter tip 1, a gas supply unit including an ion source gas nozzle 2 configured to supply gas to the tip 1 and an ion source gas supply source 3, and an ion gun unit 19 including an extracting electrode 4 configured to ionize the gas adsorbed onto the surface of the tip 1 and extract ions when a voltage is applied between the extracting electrode 4 and the tip 1, and a cathode electrode 5 configured to accelerate the ions toward a sample 13. The apparatus includes a mechanism configured to heat the tip 1 with energizing heating of a filament which supports the tip 1.

A second aperture 10 is arranged between the ion gun unit 19 and a lens system, and the lens system includes a focusing lens electrode 6 and an objective lens electrode 8 configured to focus an ion beam 11 onto the sample 13.

Accordingly, the ion beam 11 ejected from the ion gun unit 19 can be restricted.

A first aperture 7 having openings 7a is provided between the focusing lens electrode 6 and the objective lens electrode 8.

The first aperture 7 has the openings 7a having different opening diameters. By selecting the opening diameters and installing a beam axis, the amount of beam of the ion beam 11 passing therethrough can be adjusted. An adjusting mechanism 20 which is capable of moving the ion gun unit 19 relatively with respect to the lens system from the outside of the apparatus is provided.

Figure 2:
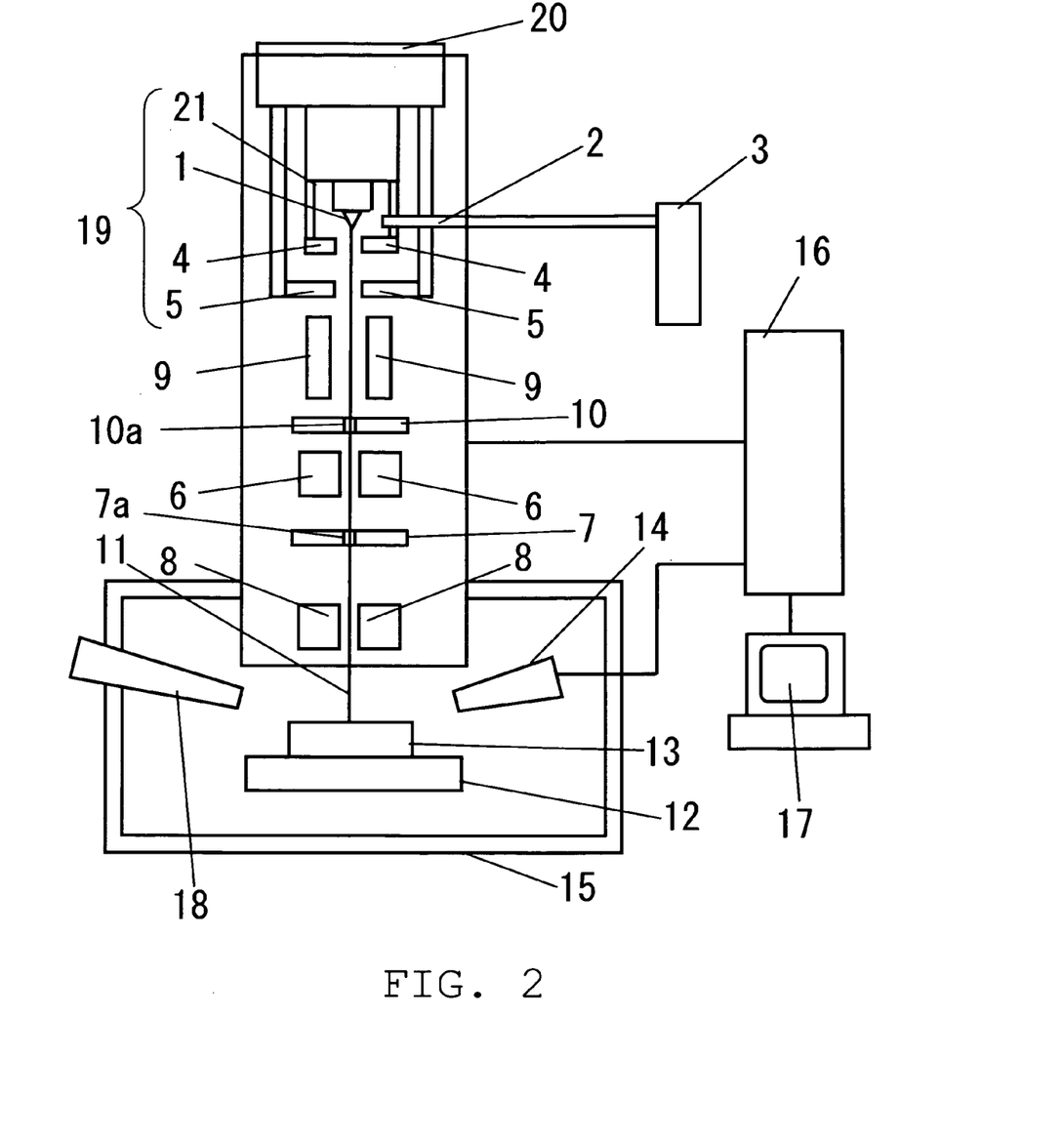
FIG. 2 is a drawing showing the configuration of a focused ion beam apparatus according to an embodiment of the invention.

As shown in FIG. 2, a gun alignment electrode 9 positioned on the side of the sample 13 with respect to the ion gun unit 19 and configured to adjust the direction of irradiation of the ion beam 11 ejected from the ion gun unit 19 is provided.

A vacuum is produced in the interior of a sample chamber 15, and a sample stage 12 which is movable with the sample 13 placed thereon, a gas gun 18 configured to provide a deposition or etching gas to the sample 13, and a detector 14 configured to detect secondary charged particles generated from the sample 13 are provided. Although it is not shown in the drawing, there is provided a valve that controls the vacuum in the sample chamber 15 and the ion gun unit 19. A control unit 16 configured to control the focused ion beam apparatus is provided. The control unit 16 includes an image forming unit configured to form an observation image from a detection signal detected by the detector 14 and a scanning signal of an ion beam therein, and displays the formed observation image on a display unit 17.

(1) Gas Field Ion Source

Figure 3:
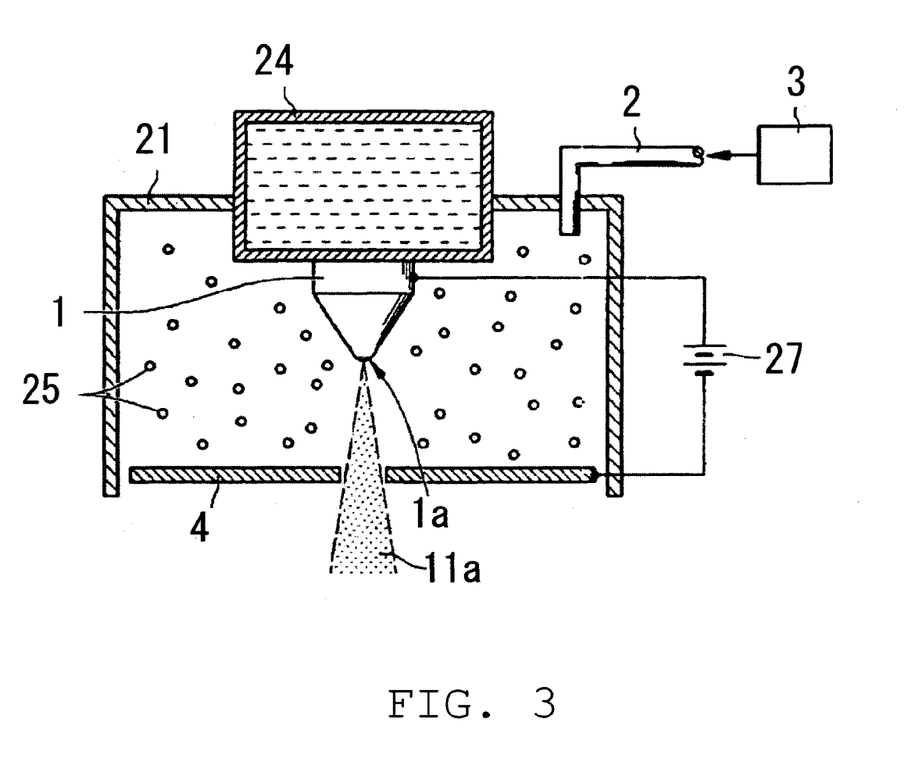
FIG. 3 is a schematic drawing of an ion gun unit of a focused ion beam apparatus according to an embodiment of the invention.

The gas field ion source includes an ion generating chamber 21, the tip 1, the extracting electrode 4, and a cooling device 24 as shown in FIG. 3.

The cooling device 24 is disposed on a wall portion of the ion generating chamber 21, and the emitter tip 1 is mounted on the cooling device 24 on a surface facing the ion generating chamber 21. The cooling device 24 is configured to cool the tip 1 with cooling medium such as liquid nitrogen or liquid helium stored therein.

As the cooling device 24, GM or pulse tube closed cycle freezing machine or a gas-flow freezing machine may be used. In addition, a temperature controlling function is provided so as to be capable of controlling the temperature to an optimum temperature according to the ion type. Then, in the vicinity of an opening end of the ion generating chamber 21, the extracting electrode 4 having the opening at a position opposing an extremity 1a of the tip 1 is disposed.

The ion generating chamber 21 is configured to be kept in a desired high-vacuum state in the interior thereof using an exhaust system, not shown. Although it is not shown, a plurality of orifices for differentiating the degree of vacuum between the sample chamber 15 and an ion gun 20 are provided.

With the provision of these orifices, inflow of ionized gas to the sample chamber or inflow of gas to be introduced into the sample chamber into an ion gun chamber are prevented. The ion source gas supply source 3 is connected to the ion generating chamber 21 via the ion source gas nozzle 2, so that a slight amount of gas (for example, Ar gas) is supplied into the ion generating chamber 21.

The gas supplied from the ion source gas supply source 3 is not limited to Ar gas, and may be other types of gases such as helium (He), neon (Ne), krypton (Kr), Xenon (Xe), hydrogen ($H_2$), oxygen ($O_2$), and nitrogen ($N_2$).

The ion source gas supply source 3 may be configured to be capable of supplying a plurality of types of gases so as to allow switching of the gas type or mixing two or more types of gases according to the application.

The tip 1 is a member formed by coating noble metal such as platinum, palladium, iridium, rhodium, or gold on a needle-like base member formed of tungsten or molybdenum, and the extremity 1a is formed into a pyramid shape sharpened at the atomic level.

Alternatively, the tip 1 obtained by sharpening the extremity 1a of the needle-like base member formed of tungsten or molybdenum at the atomic level by introducing nitrogen gas or oxygen gas, not shown, may be used as the tip 1. The tip 1 is maintained at a low temperature on the order of 100° K or lower by the cooling device 24 when the ion source is in operation. An extracting voltage is applied between the tip 1 and the extracting electrode 4 by a power source 27.

When the voltage is applied between the tip 1 and the extracting electrode 4, an extremely large electric field is formed at the sharp extremity 1a and is polarized, so that gas molecules 25 attracted to the tip 1 lose electrons via tunneling at a position of the extremity 1a having high electric field, and are turned into gas ions.

Then, the gas ions repel the tip 1 held at a positive potential and fly toward the extracting electrode 4, and ions 11a ejected from an opening of the extracting electrode 4 toward the lens system constitute the ion beam 11.

Here, the distance between the extracting electrode 4 and the center position of the extremity of the tip 1 is preferably 10 µm at the maximum. It is also possible to provide an inhibitory electrode which provides a negative potential to the tip 1 between the tip 1 and the extracting electrode 4.

The extremity 1a of the tip 1 is extremely sharp, and the gas ion is ionized in a limited area above the extremity 1a. Therefore, the width of distribution of the energy of the ion beam 11 is extremely narrow and, for example, an ion beam having a smaller beam diameter and higher intensity in comparison with a plasma gas ion source or liquid metal ion source can be obtained.

When the voltage applied to the tip 1 is too high, the constituent elements (tungsten, platinum) of the tip 1 are released and dispersed toward the extracting electrode 4 together with the gas ions. Therefore, the voltage to be applied to the tip 1 at the time of ejection of the ion beam is maintained at a level low enough that it does not cause the constituent elements of the tip 1 to be released or burst out.

In contrast, the shape of the extremity 1a can be adjusted using the operability of the constituent elements of the tip 1.

For example, an area for ionizing the gas is increased by removing the element positioned at a limit forward of the extremity 1a by intension, so that the ion beam diameter can be increased.

The tip 1 can be re-positioned by being heated without allowing the precious metal elements on the surface to burst out. Therefore, the sharp shape of the extremity 1a rounded by use can be restored.

(2) Ion Gun Unit

The ion gun unit 19 includes the electrolytically ionizing ion source and the cathode electrode 5 configured to accelerate the ion 11a passed through the extracting electrode 4 toward the sample 13. Then, the ion gun unit 19 is connected to the adjusting mechanism 20. The adjusting mechanism 20 moves the ion gun unit 19 relatively with respect to the lens system from the outside of the apparatus. Accordingly, the position of the ion beam 11 incoming into the lens system can be adjusted.

(3) Lens System

The lens system includes the focusing lens electrode 6 configured to focus the ion beam 11, the first aperture 7 configured to restrict the ion beam 11, an aligner configured to adjust the optical axis of the ion beam 11, a stigma configured to adjust an astigmatism of the ion beam 11, the objective lens electrode 8 configured to focus the ion beam 11 on the sample 13, and a scanning electrode configured to scan the ion beam 11 on the sample in sequence from the tip 1 side toward the sample 13.

In the focused ion beam apparatus in this configuration, a source size can be limited to 1 nm at the maximum and the divergence of energy of the ion beam can be limited to 1 eV at the maximum, so that the beam diameter can be restricted to 1 nm or smaller. A mass filter of E×B or the like for selecting an atomic number of ion may be provided.

(4) Improvement of Performance of Ion Beam

Figure 4:
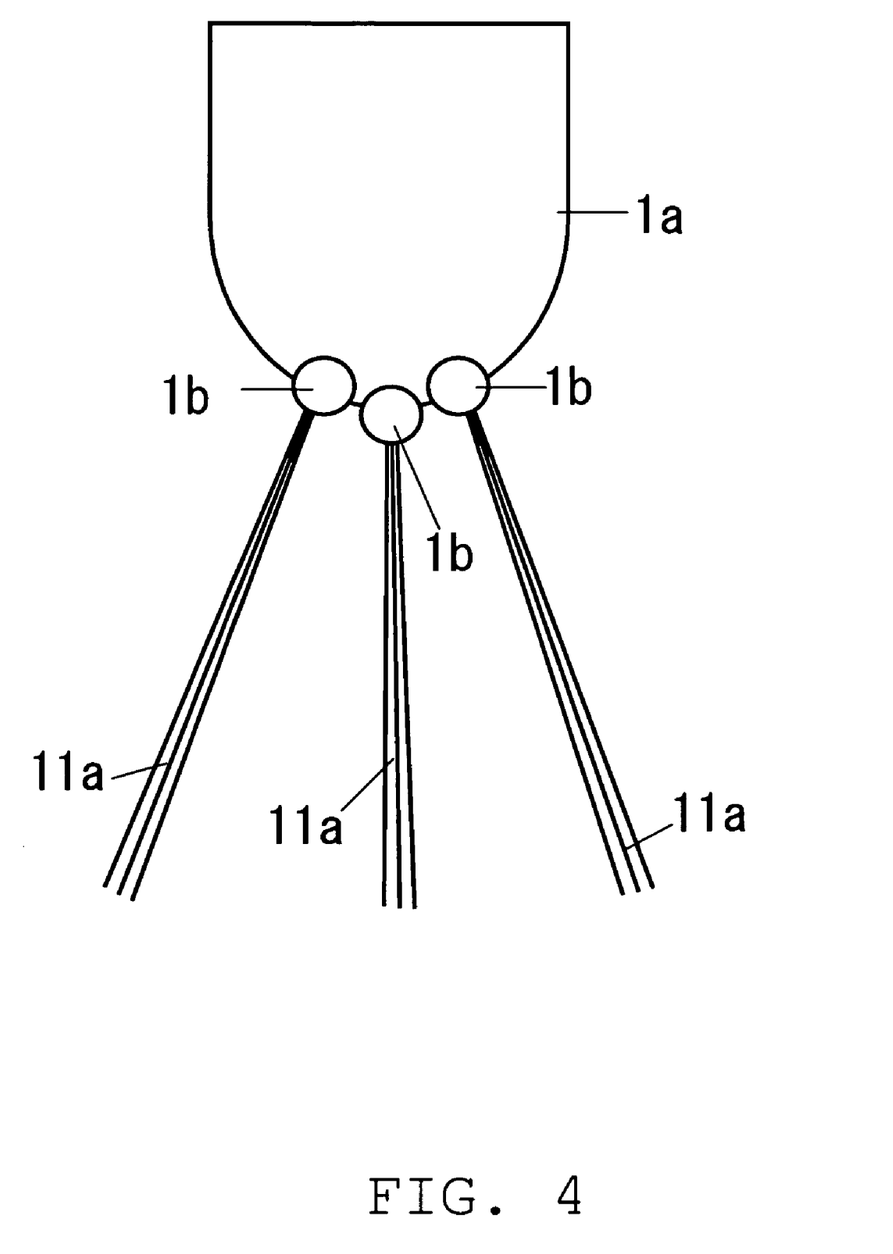
FIG. 4 is a schematic drawing of an extremity of a tip of a focused ion beam apparatus according to an embodiment of the invention.

In the gas field ion source, as shown in FIG. 4, the ions 11a are emitted toward the minute structure of the extremity 1a, that is, in the direction reflecting a projecting portion 1b of the extremity. As shown in FIG. 4, when a plurality of the projecting portions 1b exist, the ions 11a are ejected in a plurality of directions. The angle of divergence of the beam of ions 11a in the respective directions is as narrow as several degrees.

Figure 7:
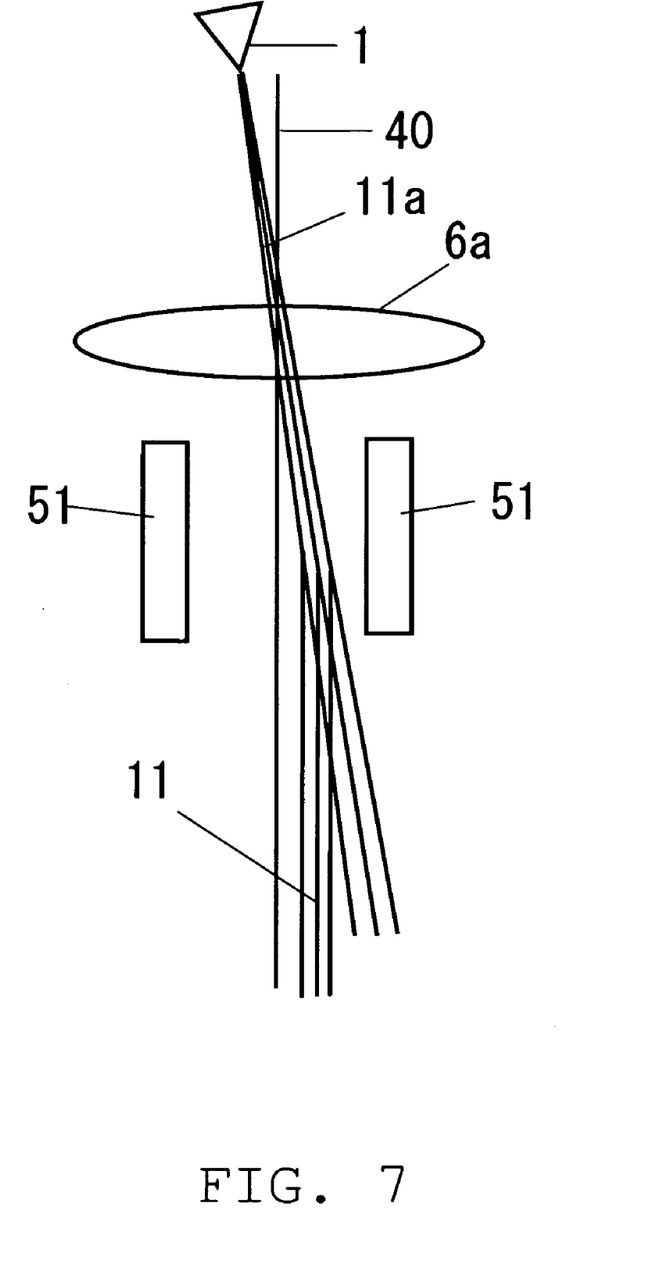
FIG. 7 is a schematic drawing showing a focused ion beam apparatus in the related art.

FIG. 7 is a schematic drawing of the focused ion beam in the related art. The direction of radiation of the ions 11a is different from an optical axis 40. The ions 11a ejected from the tip 1 enter a focusing lens electric field 6a, and then, the direction of irradiation of the ions 11a is adjusted by an aligner 51. It is also possible to adjust the ions 11a so as to pass through the center of the focusing lens by the adjusting mechanism 20.

However, since the direction of irradiation of the ions 11a is different from the optical axis 40, which is the central axis of the optical system of the focused ion beam, the ions 11a enter obliquely with respect to the focusing lens electric field 6a.

Oblique entrance of the ions 11a into the lens causes aberration, and collapse the beam shape converged on the sample 13. When the ions 11a are ejected from the tip 1 in the plurality of directions, the ions 11a in the direction of the outer periphery pass outside the lens instead of the center. The ions 11a passing outside are significantly bent by the focusing lens, and are mixed with the ions 11a passing through the center. Therefore, the peripheral component is an unnecessary component on the background in contrast to the central component, and the distribution of the beam of the ions 11a, that is, the beam profile, is deteriorated on the sample 13.

From the reasons described above, it is required to allow the ions 11a to enter the center of the lens of the lens system in only one direction in parallel to the optical axis.

Figure 5:
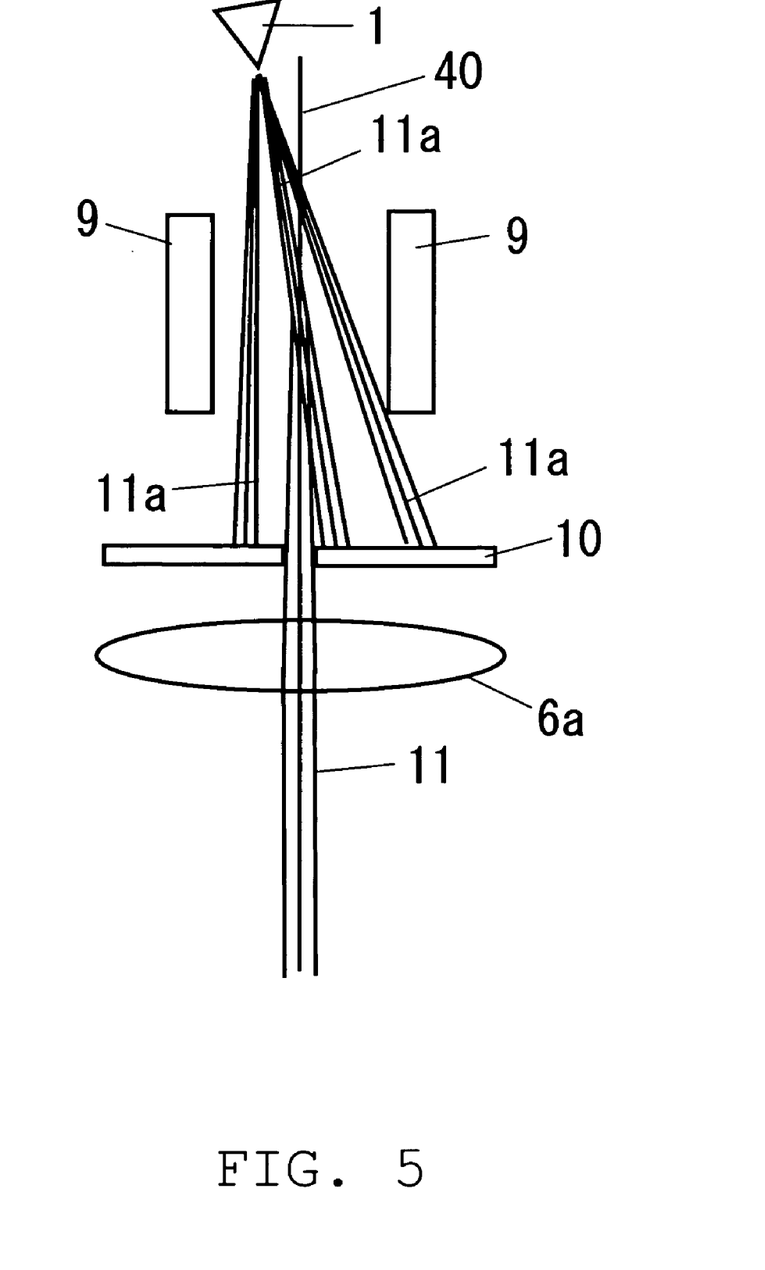
FIG. 5 is a schematic drawing showing a focused ion beam apparatus according to an embodiment of the invention.

FIG. 5 is a schematic drawing of the focused ion beam apparatus according to the invention. The focused ion beam apparatus includes the gun alignment electrode 9 and the second aperture 10 on a ground portion on the side of the tip 1 with respect to the focusing lens electric field 6a. Even when the ions 11a are ejected in the direction different from the direction of the optical axis 40 from the tip 1, the ions 11a can be caused to enter the focusing lens electric field 6a in substantially parallel to the optical axis 40 by the gun alignment electrode 9.

It is also possible to select only the ions 11a ejected in one direction by the second aperture 10 to cause the same to enter the center of the focusing lens electric field 6a.

Accordingly, an accurate position on the surface of the sample 13 can be irradiated with the focused ion beam 11.

Figure 6:
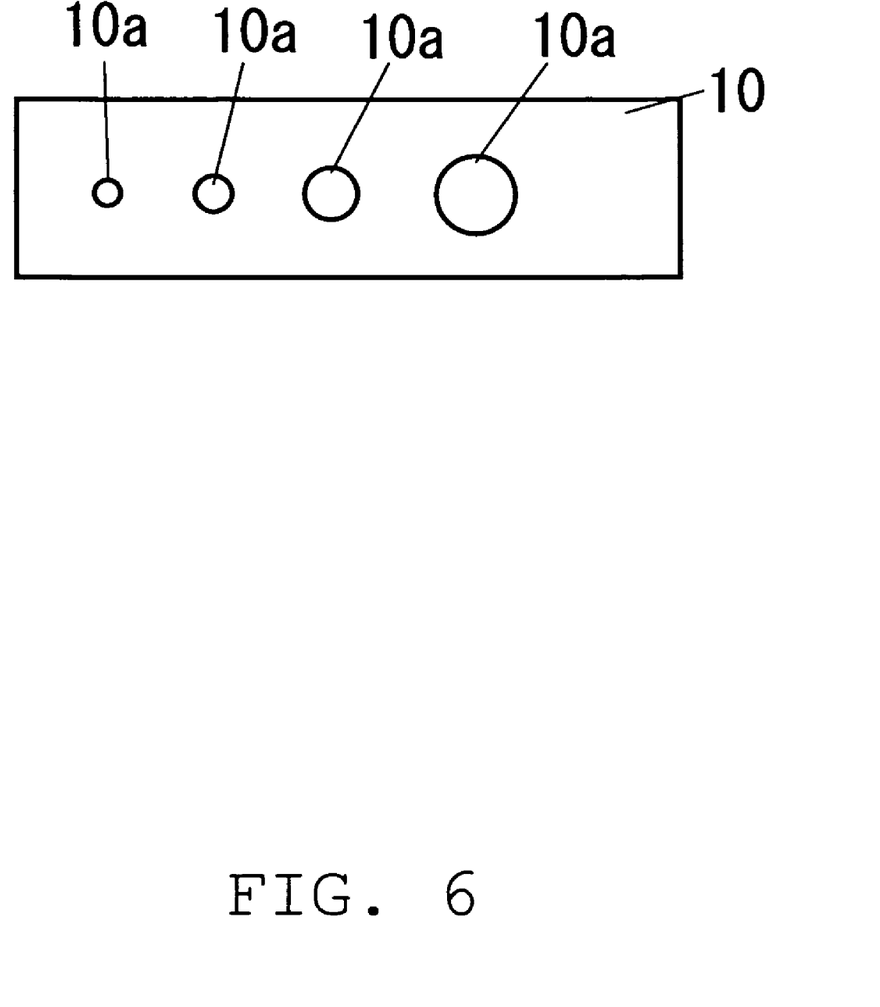
FIG. 6 is a drawing showing a configuration of an aperture of a focused ion beam apparatus according to an embodiment of the invention.

As shown in FIG. 6, the second aperture 10 includes a plurality of openings 10a having different diameters.

Accordingly, the diameter of the opening 10a to be arranged at the axis of irradiation of the ion beam 11 can be changed, and the current amount of the ion beam 11 passing therethrough can be adjusted.

Furthermore, the adjusting mechanism 20 is capable of moving the ion gun unit 19 relatively with respect to the lens system, so that the position of irradiation of the ion beam 11 ejected from the ion gun unit 19 is adjusted. Accordingly, the position of irradiation of the ion beam 11 is adjusted, so that the ion beam 11 can be caused to enter the center of the lens of the focusing lens electric field 6a.

The gun alignment electrode 9 and the second aperture 10 are preferably arranged in this order with respect to the tip 1. The reason is that if the distance of the gun alignment electrode 9 from the ion source is increased, the distance of movement of the adjusting mechanism 20 is increased and the aberration is increased because the beam passes outside the axis with respect to the polarizer, thereby collapsing the beam shape.

In the invention, the parallel movement and the adjustment of the direction of the beam are achieved with the adjusting mechanism 20 and the gun alignment electrode 9, respectively. However, as an alternative configuration, the parallel movement and the adjustment of direction can be performed by providing two levels of alignment electrodes immediately below the ion source and tilting and shifting the beam.

It is also possible to search the position of the ion source by supplying the scanning signal to the gun alignment electrode 9 to allow the scanning on the aperture.

Alternatively, it is also possible to insulate the second aperture 10 electrically to measure the electric current and use the measured current as a monitor of an emission current of the ion source. It is also possible to adjust the extracting voltage or the gas flow rate to maintain the emission current constant using this monitoring function.

(5) Gas Gun

The gas gun 18 is configured to supply source gas (for example, carbonic gas such as phenanthrene, naphthalene, or metallic compound gas containing metal such as platinum and tungsten) of a deposition film on the surface of the sample 13 from a source container through a nozzle.

When performing the etching process, the etching gas (for example, xenon fluoride, chlorine, iodine, chlorine trifluoride, fluorine monoxide, water, etc.) may be supplied from the source container through the nozzle.

EXAMPLE 1

A method of beam adjustment according to the embodiment will be described. The opening 10a having the largest diameter on the second aperture 10 is arranged on the axis of irradiation of the ion beam 11. The adjustment mechanism 20 is operated while observing a secondary electron image in a state in which the ion beam is irradiated from the tip 1 of the ion gun unit 19, and the position of the ion gun unit 19 with respect to the lens system where a large amount of the ion beam reaches the sample 13 is searched.

The voltage applied to the objective lens electrode 8 is varied at the position of the ion gun unit 19 where the large amount of ion beam reaches the sample 13, and the voltage applied to the gun alignment electrode 9 is adjusted so that the secondary electron image does not move even when the voltage is varied.

Subsequently, the voltage applied to the focusing lens electrode 6 is varied, and the adjusting mechanism 20 is operated to adjust the position of the ion gun unit 19 so that the secondary electron image does not move even when the voltage is varied.

Subsequently, the opening 10a having a small diameter on the second aperture 10 is arranged on the axis of irradiation of the ion beam 11. If the re-adjustment is necessary, the process of adjustment described above is performed again.

Accordingly, even when the direction of the tip 1 is displaced with respect to the surface of the sample 13, the ion beam 11 can be directed to a position near the center of the focusing lens and, in addition, the sample 13 can be irradiated with the ion beam 11 having a well-formed beam profile by restricting an unnecessary component by the aperture.

EXAMPLE 2

An observing and processing method according to the embodiment will be described. Helium gas is supplied to the tip 1 cooled by the cooling device 24 via the ion source gas nozzle 2 to cause the helium gas to adsorb onto the tip 1.

The helium gas adsorbed on the tip 1 is ionized by applying a voltage between the tip 1 and the extracting electrode 4, and ions 11a are ejected toward the lens system from the opening of the extracting electrode 4.

The center portion of the ion beam 11 deflected along the axis of irradiation by the gun alignment electrode 9 passes through the opening of the second aperture 10, and enters the center portion of the focusing lens. The surface of the sample 13 is irradiated with the ion beam 11 focused by the lens system.

The secondary electrons generated from the sample 13 are detected by the detector 14. The detector 14 used here is preferably a secondary electron detector when detecting the secondary electrons, and a secondary ion detector when detecting the secondary ions. In addition, when detecting the reflected ions, a reflected ion detector can be used.

The image forming unit in the control unit 16 forms a secondary electron image from the detection signal from the detector 14 and the scanning signal that inputs the ion beam 11 to the scanning electrode. Accordingly, the surface of the sample 13 is observed.

Etching gas is supplied from the gas gun 18 to the surface of the sample 13 and scanning is performed by the irradiation of the ion beam 11. The sample 13 is etched in an area irradiated with the ion beam 11, so that processing can be performed locally.

Source gas for the deposition film is supplied from the gas gun 18 onto the surface of the sample 13 and scanning is performed by the irradiation of the ion beam 11. The deposition film is formed in an area irradiated with the ion beam 11, so that local film formation is achieved.

What is claimed is:

1. A focused ion beam apparatus comprising:
    a gas field ion gun unit including an emitter tip, a gas supply unit to supply gas to the tip, an extracting electrode to ionize the gas adsorbed onto the surface of the tip and extract ions by applying a voltage between the extracting electrode and the tip, and a cathode electrode that accelerates the ions in the form of an ion beam toward a sample;
    an aperture member having an opening for allowing therethrough passage of a part of the ion beam ejected from the gas field ion gun unit; and
    a lens system including a focusing lens electrode configured and arranged to focus the ion beam that passes through the opening of the aperture member and an objective lens electrode configured to focus the ion beam onto the sample.

2. The focused ion beam apparatus according to claim 1, wherein the lens system is arranged on the side of the sample with respect to the aperture.

3. The focused ion beam apparatus according to claim 1, wherein the aperture member is electrically insulated and functions to measure the amount of electric current of the ion beam ejected from the gas field ion gun unit.

4. The focused ion beam apparatus according to claim 1, further comprising a gun alignment electrode configured to adjust the direction of irradiation of the ion beam ejected from the gas field ion gun unit.

5. The focused ion beam apparatus according to claim 4, wherein the lens system is arranged on the side of the sample with respect to the gun alignment electrode.

6. The focused ion beam apparatus according to claim 1, wherein the gas field ion gun unit includes a moving mechanism configured to move the gas field ion gun unit with respect to the lens system to adjust the position of irradiation of the ion beam ejected from the gas field ion gun unit.

7. A focused ion beam apparatus comprising:
    a gas field ion gun unit including an emitter tip, a gas supply unit that supplies gas to the tip so that the gas adsorbs on the surface of the tip, an extracting electrode that ionizes the gas adsorbed on the surface of the tip and extracts ions by applying a voltage between the extracting electrode and the tip, and a cathode electrode that accelerates the ions in the form of an ion beam toward a sample;
    a lens system, including a focusing lens electrode and an objective lens electrode, that transmits the ion beam along an optical axis of the lens system and focuses the ion beam onto the sample; and
    an aperture member disposed between the gas field ion gun unit and the lens system, the aperture member having an opening which is situated on the optical axis and through which the ion beam passes before entering the lens system.

8. A focused ion beam apparatus according to claim 7; wherein the opening in the aperture member is configured and arranged to prevent ions ejected from the gas field ion gun unit, except ions near the optical axis, from entering the lens system.

9. A focused ion beam apparatus according to claim 8; wherein the aperture member has a plurality of openings of different sizes and is movable to position any selected one of the openings on the optical axis.

10. A focused ion beam apparatus according to claim 8; wherein the aperture member is electrically insulated and functions to measure the amount of electric current of the ion beam ejected from the gas field ion gun unit.

11. A focused ion beam apparatus according to claim 8; further comprising a gun alignment electrode configured to adjust the direction of irradiation of the ion beam ejected from the gas field ion gun unit.

12. A focused ion beam apparatus according to claim 8; wherein the gas field ion gun unit includes a moving mechanism configured to move the gas field ion gun unit with respect to the lens system to adjust the position of irradiation of the ion beam ejected from the gas field ion gun unit.

13. A focused ion beam apparatus according to claim 7; wherein the aperture member has a plurality of openings of different sizes and is movable to position any selected one of the openings on the optical axis.

14. A focused ion beam apparatus according to claim 7; wherein the aperture member is electrically insulated and functions to measure the amount of electric current of the ion beam ejected from the gas field ion gun unit.

15. A focused ion beam apparatus according to claim 7; further comprising a gun alignment electrode configured to adjust the direction of irradiation of the ion beam ejected from the gas field ion gun unit.

16. A focused ion beam apparatus according to claim 7; wherein the gas field ion gun unit includes a moving mechanism configured to move the gas field ion gun unit with respect to the lens system to adjust the position of irradiation of the ion beam ejected from the gas field ion gun unit.

* * * * *